United States Patent
Van Pelt et al.

(10) Patent No.: US 10,856,436 B2
(45) Date of Patent: Dec. 1, 2020

(54) MULTILEVEL ENCLOSURE COOLING

(71) Applicant: Seagate Technology LLC, Cupertino, CA (US)

(72) Inventors: Kevin Lee Van Pelt, Longmont, CO (US); Lon Matthew Stevens, Longmont, CO (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 16/263,980

(22) Filed: Jan. 31, 2019

(65) Prior Publication Data
US 2020/0253084 A1    Aug. 6, 2020

(51) Int. Cl.
| H05K 7/20 | (2006.01) |
| G06F 1/20 | (2006.01) |
| G11B 33/08 | (2006.01) |
| G06F 1/18 | (2006.01) |
| G11B 33/14 | (2006.01) |

(52) U.S. Cl.
CPC ......... *H05K 7/20172* (2013.01); *G06F 1/187* (2013.01); *G06F 1/20* (2013.01); *G06F 1/206* (2013.01); *G11B 33/08* (2013.01); *G11B 33/142* (2013.01); *H05K 7/20563* (2013.01)

(58) Field of Classification Search
CPC . G06F 1/20; G06F 1/187; G06F 1/206; G06F 2200/201; G11B 33/142; G11B 33/08; H05K 7/20736; H05K 7/20727; H05K 7/20836; H05K 7/20745; H05K 7/20172; H05K 7/20209; H05K 7/20136; H05K 7/20145; H05K 7/20581; H05K 5/0213; H05K 7/20572; H01L 23/467
See application file for complete search history.

(56) References Cited

U.S. PATENT DOCUMENTS

| 6,826,456 B1 * | 11/2004 | Irving | G06F 1/20 |
| | | | 361/695 |
| 6,950,895 B2 | 9/2005 | Bottom | |
| 7,139,170 B2 * | 11/2006 | Chikusa | G06F 1/20 |
| | | | 361/695 |
| 7,200,008 B1 * | 4/2007 | Bhugra | G11B 25/043 |
| | | | 361/679.21 |
| 7,742,308 B1 * | 6/2010 | King, Jr. | H05K 7/1489 |
| | | | 211/26 |
| 7,933,120 B2 | 4/2011 | Tanaka et al. | |

(Continued)

OTHER PUBLICATIONS

Delta Electronics, Specification of AFB1548VH-CD8G, Jun. 19, 2017, retrieved from "https://www.delta-fan.com/Download/Spec/AFB1548VH-CD8G.pdf" (Year: 2017).*

(Continued)

*Primary Examiner* — Adam B Dravininkas
(74) *Attorney, Agent, or Firm* — Faegre Drinker Biddle & Reath

(57) ABSTRACT

A system including an enclosure including a data storage enclosure. The data storage enclosure includes multiple storage levels and a shared cooling area. The system further includes data storage devices positioned within each of the multiple storage levels and a first and second set of air movers positioned within the data storage enclosure in the shared cooling area. The first and second sets of air movers are arranged to cool the data storage devices.

20 Claims, 4 Drawing Sheets

(56) References Cited

U.S. PATENT DOCUMENTS

| | | | |
|---|---|---|---|
| 8,045,328 B1* | 10/2011 | Chen | H05K 7/20727 165/121 |
| 8,817,474 B2 | 8/2014 | Campbell et al. | |
| 8,838,286 B2* | 9/2014 | Florez-Larrahondo | G06F 1/206 700/300 |
| 9,241,427 B1* | 1/2016 | Stevens | G11B 33/142 |
| 9,763,350 B2* | 9/2017 | Rust | H05K 7/14 |
| 9,820,409 B1* | 11/2017 | Ross | H05K 7/20736 |
| 9,832,088 B2 | 11/2017 | Myrah et al. | |
| 10,240,615 B1* | 3/2019 | Kho | F04D 29/703 |
| 10,368,466 B1* | 7/2019 | Frink | H05K 7/20145 |
| 10,390,462 B2* | 8/2019 | Curtis | H05K 7/20145 |
| 2004/0008484 A1* | 1/2004 | Konshak | G06F 1/184 361/679.5 |
| 2004/0130868 A1* | 7/2004 | Schwartz | G06F 1/20 361/679.48 |
| 2007/0127207 A1* | 6/2007 | Katakura | G11B 33/12 361/694 |
| 2007/0233781 A1* | 10/2007 | Starr | G11B 33/126 709/203 |
| 2008/0174948 A1* | 7/2008 | Davis | G11B 33/127 361/679.31 |
| 2009/0016019 A1* | 1/2009 | Bandholz | G06F 1/20 361/695 |
| 2009/0265045 A1* | 10/2009 | Coxe, III | G06F 1/20 700/300 |
| 2010/0033930 A1* | 2/2010 | Wada | G11B 33/142 361/695 |
| 2012/0327597 A1* | 12/2012 | Liu | H05K 7/20736 361/692 |
| 2014/0052807 A1 | 2/2014 | Lin | |
| 2014/0293523 A1* | 10/2014 | Jau | H05K 7/14 361/679.4 |
| 2014/0364048 A1* | 12/2014 | Milligan | H05K 7/20736 454/184 |
| 2017/0112015 A1* | 4/2017 | Kang | G06F 1/266 |
| 2017/0235347 A1* | 8/2017 | Heyd | G11B 33/128 361/679.31 |
| 2017/0303428 A1 | 10/2017 | Hayashi | |
| 2018/0235105 A1* | 8/2018 | Curtis | H05K 7/20727 |

OTHER PUBLICATIONS

Activia, Specification sheet of D22060-TK, retrieved Mar., 29, 2020, https://www.activa.com.tw/products_DC_Axial_cooling_fan_D22060-T.html (Year: 2020).*

Morgan, Timothy Prickett, "Microsoft Azure Goes Back to Rack Servers with Project Olympus," The Next Platform, https://www.nextplatform.com/2016/11/01/microsoft-azure-goes-back-rack-servers-project-olympus/ (Nov. 1, 2016).

* cited by examiner

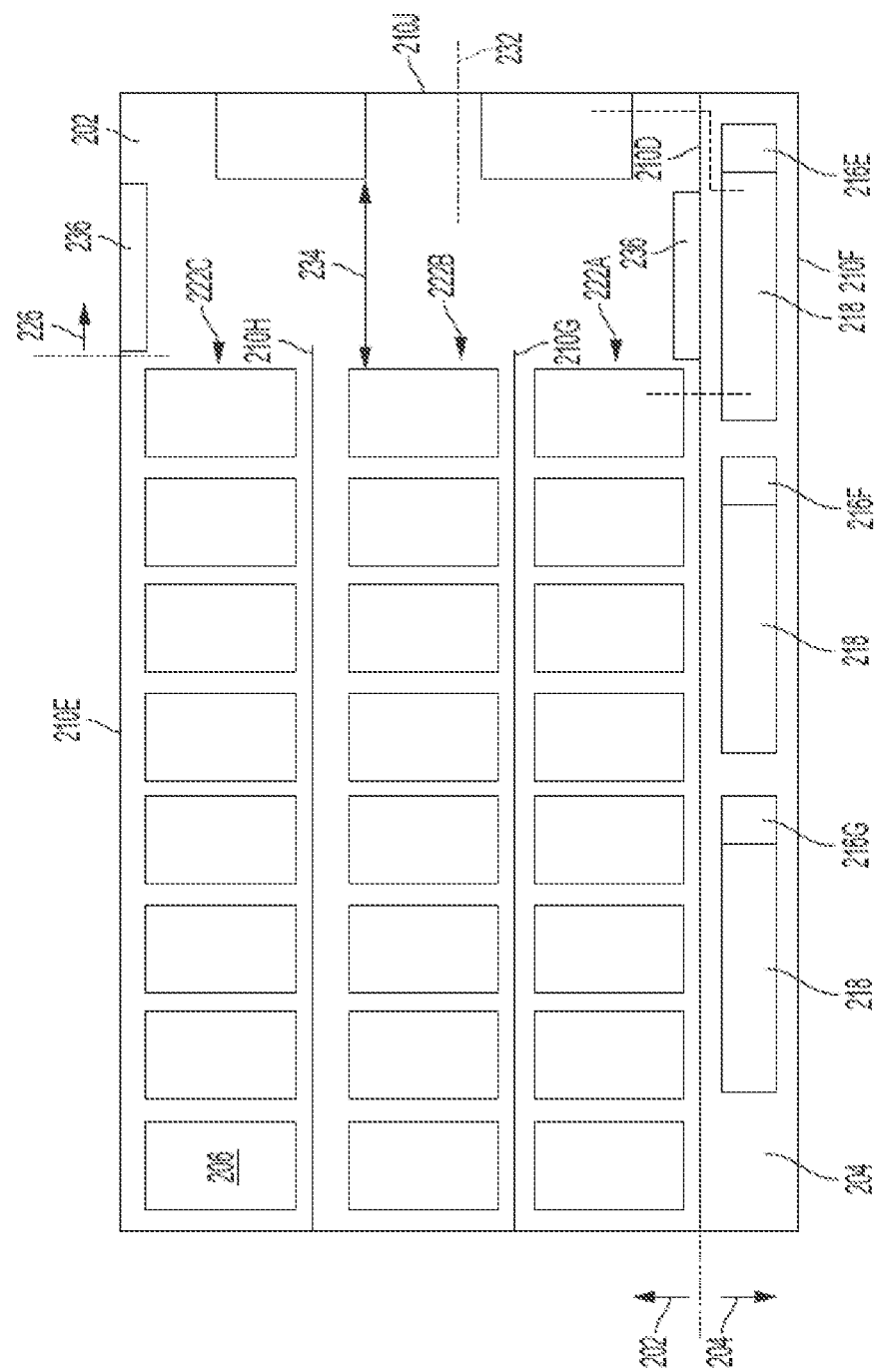

MULTILEVEL ENCLOSURE COOLING

SUMMARY

In certain embodiments, a system includes an enclosure with a data storage enclosure. The data storage enclosure includes multiple storage levels and a shared cooling area. The system further includes data storage devices, a first set of air movers, and a second set of air movers. The data storage devices are positioned within each of the multiple storage levels, and the first and second sets of air movers are positioned within the data storage enclosure in the shared cooling area. The first set of air movers is positioned at a first height, and the second set of air movers is positioned at a second height.

In certain embodiments, a data storage system includes a rack. The rack includes multiple enclosures. Each enclosure includes a power supply enclosure and a data storage enclosure with multiple data storage levels and a shared cooling area. Each enclosure includes data storage devices positioned among the multiple data storage levels and air movers positioned in the first shared cooling area to cool the data storage devices. A power supply unit is positioned within the power supply enclosure.

In certain embodiments, a method for powering and cooling electronic devices is disclosed. The method includes powering, via one or more power supply units positioned within a power supply enclosure, the electronic devices positioned among multiple slideable device levels in an enclosure. The method also includes powering, via the one or more power supply units, air movers positioned in a shared cooling area in the enclosure to draw air across each of the multiple slideable device levels.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 4 shows a side sectional view of the enclosure of FIGS. 2 and 3, in accordance with certain embodiments of the present disclosure.

Figure 1:
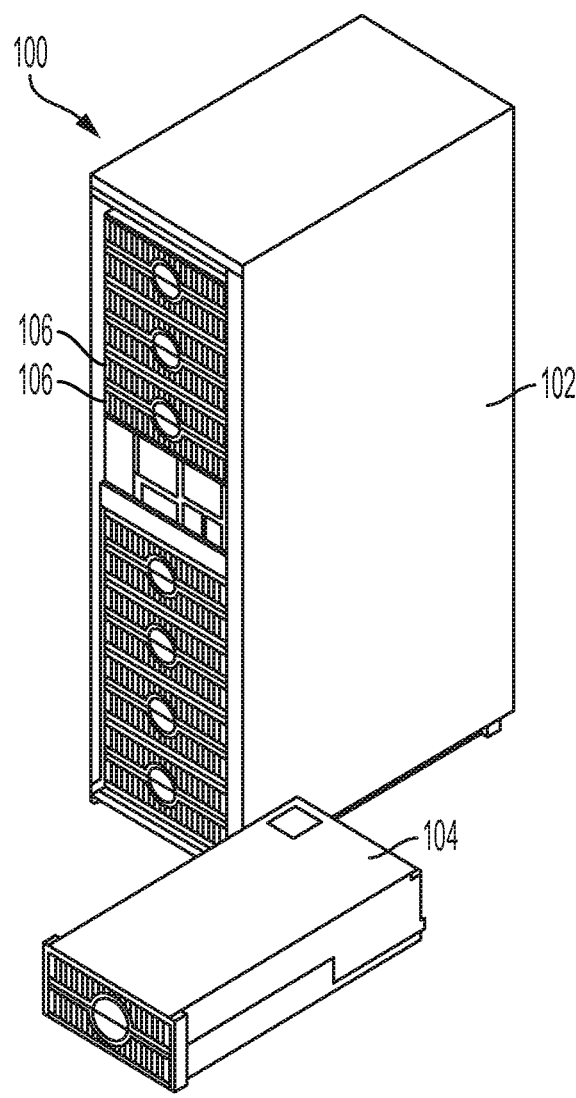
FIG. 1 shows a perspective view of a storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems are used to store and process vast amounts of data. It can be challenging to keep the systems within a desired temperature range because of the amount of heat the systems typically generate during operation. For example, data storage devices generate heat during operation as well as the power supply units that power the data storage devices. Data storage systems can include cooling devices such as air movers (e.g., fans) that assist with operating the systems within the desired temperature range. However, air movers generate undesirable acoustic energy that may be transmitted throughout the system and that affects performance of data storage devices housed within the system. Certain embodiments of the present disclosure feature arrangements of cooling devices and/or power supply units that reduce the amount of acoustic energy that affects the data storage devices' performance.

FIG. 1 shows a data storage system 100 including a rack 102 (e.g., a cabinet) with a plurality of enclosures 104. Each enclosure 104 can include multiple drawers or storage levels 106 that house electronic devices such as data storage devices installed within the drawers or storage levels 106. Each enclosure 104 itself can be arranged in a drawer-like fashion to slide into and out of the rack 102, although the enclosures 104 are not necessarily arranged as such.

Figure 2:
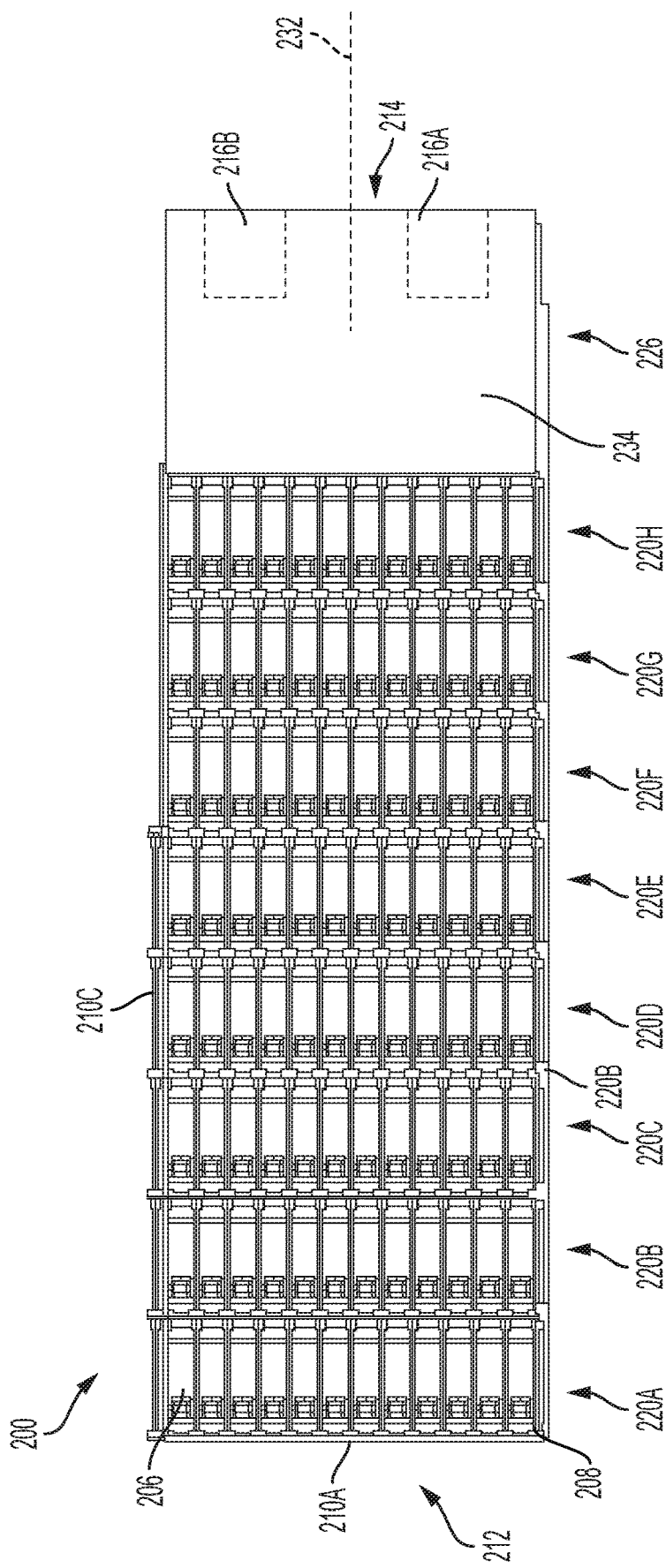
FIG. 2 shows a top view of an enclosure, in accordance with certain embodiments of the present disclosure.
Figure 3:
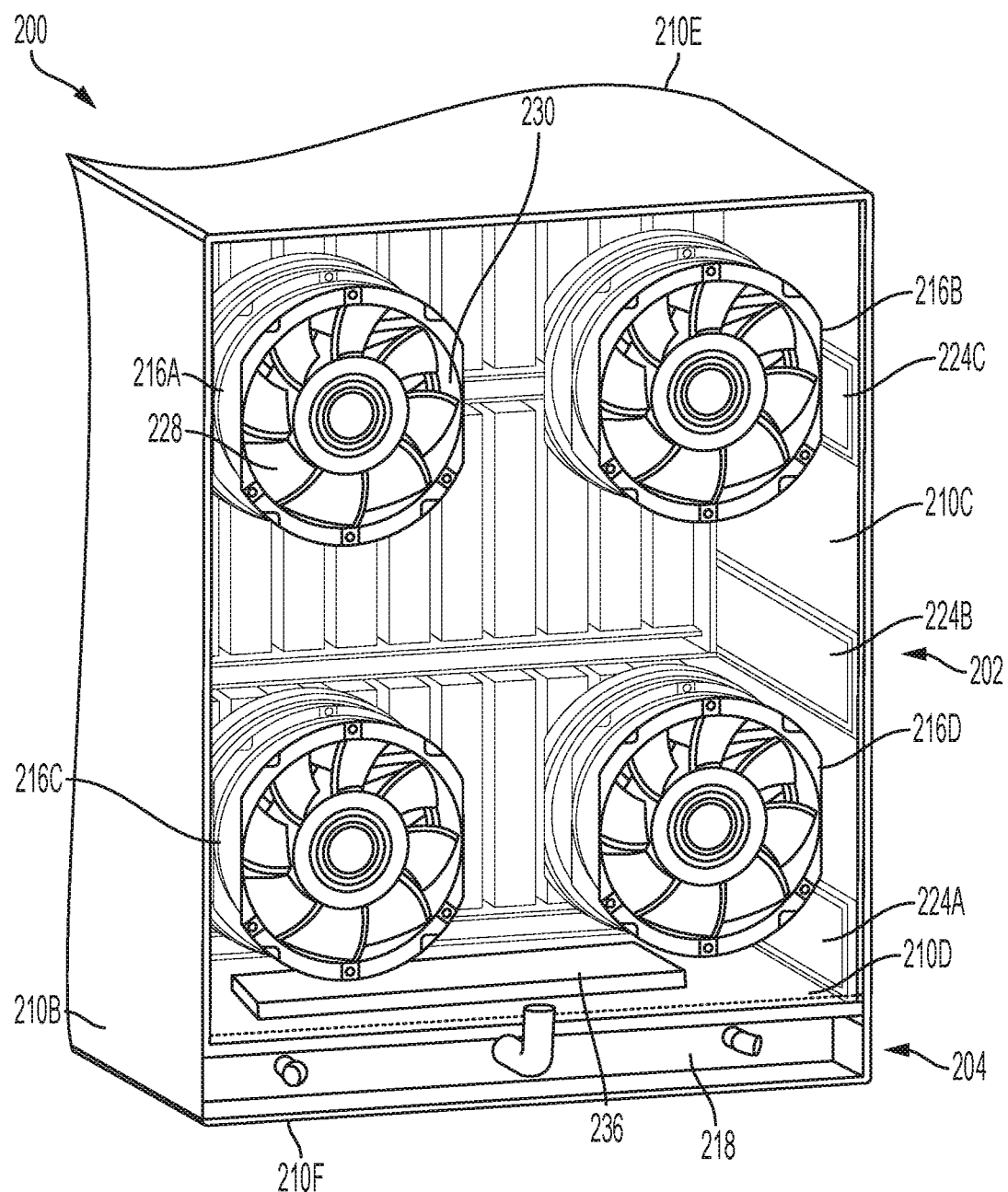
FIG. 3 shows a perspective view of a back end of the enclosure of FIG. 2, in accordance with certain embodiments of the present disclosure.

FIG. 2 shows a top view of an enclosure 200, which can be utilized in a data storage system such as the data storage system 100 of FIG. 1. For example, a rack such as the rack 102 in FIG. 1 can include multiple individual enclosures such as the enclosure 200. FIG. 3 shows a perspective view of a back end of the enclosure 200, and FIG. 4 shows a side section view of the enclosure 200. The enclosure 200 is separated into a data storage enclosure 202 and a power supply enclosure 204.

The enclosure 200 includes data storage devices 206 (e.g., hard disc drives and/or solid state drives) positioned within the data storage enclosure 202 and includes a chassis 208. The exterior of the chassis 208 includes a front side wall 210A, first side wall 210B, a second side wall 210C, a first bottom wall 210D (shown in FIGS. 3 and 4), and a top cover 210E (shown in FIGS. 3 and 4).

The data storage enclosure 202 is shown as being formed by all or portions of the front side wall 210A, the first side wall 210B, the second side wall 210C, a first bottom wall 210D (shown in FIGS. 3 and 4), the top cover 210E (shown in FIGS. 3 and 4), and a second bottom wall 210F (shown in FIGS. 3 and 4). The power supply enclosure 204 is shown as being formed by all or portions of the front side wall 210A, the first side wall 2108, the second side wall 210C, the first bottom wall 210D, and the second bottom wall 210F. Each wall of the chassis 208 may be constructed of multiple wall components assembled together or by a single component (e.g., formed by one piece of sheet metal). The chassis walls can be made of metal (e.g., aluminum, steel) in the form of sheets of metal. The enclosure 200 (including the data storage enclosure 202 and the power supply enclosure 204) extends between a front end 212 and a back end 214.

When assembled, the chassis 208 houses and supports the data storage devices 206, cooling devices 216A-D which are hereinafter referred to as air movers (e.g., fan modules), power supply units 218, and various other electrical components such as wiring and circuit boards (not shown).

The data storage enclosure 202 houses the data storage devices 206. As shown in FIG. 2, the data storage enclosure 202 includes eight rows of separate data storage areas 220A-H extending between the first side wall 210B and the second side wall 210C, although fewer or more rows of data storage devices 206 can be incorporated into the data storage enclosure 202. As shown in FIG. 4, the data storage enclosure 202 includes multiple data storage levels 222A-C. Each data storage level 222A-C includes multiple rows of data storage devices 206. The data storage devices 206 positioned on the first data storage level 222A are supported by the first bottom wall 210D of the chassis 208; the data storage devices 206 positioned on the second data storage level 222B are support by a third bottom wall 210G; and, the data storage devices 206 positioned on the third data storage level 222C are supported by a third bottom wall 210H. In certain embodiments, each separate data storage level 222A-C includes separate side walls such that each data storage level 222A-C forms a separate and at least partial enclosure.

In certain embodiments, the data storage enclosure 202 includes slide features 224A-C coupled to or formed as part of the first side wall 2108 and the second side wall 210C. The slide features 224A-C allow each data storage level 222A-C to be slid into and out of the data storage enclosure 202. Each data storage level 222A-C can include corresponding features (e.g., wheels) that are operatively coupled to the slide features 224A-C so that the data storage levels 222A-C can be easily slid into and out of the data storage enclosure 202.

The data storage enclosure 202 includes a cooling area 226 extending from the back end 214 of the enclosure 200 where multiple air movers 216A-D are positioned. The air movers 216A-D can be fan modules with blades 228 (shown in FIG. 3) that rotate around a respective rotation axis 230. The air movers 216A-D are affixed to a back wall 210J (which is absent in FIG. 3 to show details of the interior of the data storage enclosure 202) of the chassis 208 to the enclosure 200. In certain embodiments, vibration dampers such as rubber grommets are coupled between the air movers 216A-D and the back wall 210J to help reduce the amount of chassis vibration transmitted to the rest of the enclosure 200. As shown in FIGS. 3 and 4, two of the air movers 216A and 216B are positioned at a height different and higher than the other two air movers 216C and 216D positioned in the data storage enclosure 202. The air movers 216A-D draw air from the front end 212 of the enclosure 200 towards the back end 214 of the enclosure 200 and then move the air out of the data storage enclosure 202.

As enclosures are more densely packed with data storage devices, enclosures require more cooling to maintain desired operating temperatures for the data storage devices. Although adding more fans to enclosures or increasing the speed at which fans operate can provide better cooling for enclosures, these approaches increase power consumption and increase the amount of acoustic energy generated by fans and transmitted through the enclosure. As fan blades rotate, the fans generate acoustic energy (e.g., energy transmitted through air), which can affect the performance of data storage devices. When acoustic energy is transmitted to data storage devices, the data storage devices vibrate which affects their ability to write data and read data. For data storage devices that are hard disk drives, the vibration resulting from acoustic energy makes it difficult for the read/write heads in the hard disk drives to settle on or follow a desired data track for data reading and data writing operations. The risk of acoustic energy affecting performance increases as hard disk drives store more data per disk and therefore require finer positioning of the read/write heads. The performance impact on data storage devices in enclosures is particularly pronounced for data storage devices positioned closest to the fans.

Instead of adding more fans and/or increasing the operating speed of the fans, the data storage enclosure 202 of the present disclosure features air movers 216A-D that are "shared" among the multiple data storage devices 206 and among the multiple data storage levels 222A-C. The data storage enclosure 202 includes fewer air movers 216A-D (e.g., four) than conventional enclosures. For example, conventional enclosures typically use multiple fans arranged to cool a single data storage level in an enclosure such that each data storage level is associated and cooled by a dedicated set of fans. In such conventional arrangements, the enclosure includes at least two fans for each data storage level. In certain embodiments of the present disclosure, the air movers 216A-D are positioned with respect to the data storage levels 222A-C such that the air drawn by the air movers 216A-D is drawn from and across multiple data storage levels 222A-C. As such, the air movers 216A-D are shared and not positioned to be dedicated to a drawer or data storage level. Using fewer air movers in an enclosure via sharing air movers among multiple data storage levels can help reduce the total amount of acoustic energy generated by air movers in the enclosure.

The present disclosure features another approach for reducing acoustic energy, involving incorporation of larger-than-conventional air movers 216A-D in the data storage enclosure 202. In conventional arrangements with standard-sized enclosures (e.g., 3U, 4U), there is limited space for fans thus limiting the size of the fans that can be used. For example, fans in conventional enclosure arrangements are typically limited to being approximately 80 or fewer millimeters in diameter. In certain embodiments of the present disclosure, the air movers 216A-D can have diameters in a range such as 150-220 mm because the air movers 216A-D are not limited by the height of individual drawers and data storage levels. For example, the diameter of the air movers 216A-D can be larger than the heights of the respective data storage levels 222A-C. Larger air movers can operate at lower speeds to satisfy a given cooling need requirement as compared to smaller air movers. For example, a smaller air mover may need to operate at 15,000 rpm to provide the same cooling effect as a larger air mover operating at 7,000 rpm. As such, in certain embodiments of the present disclosure, the air movers 216A-D can operate in ranges such as 5,000-10,000 rpm as opposed to the higher operating speeds (e.g., 12,000 rpm, 15,000 rpm) required when using smaller-diameter air movers. Air movers operating at lower speeds generate less acoustic energy. The present disclosure's approach of using fewer but larger air movers 216A-D can reduce the total amount of acoustic energy generated and transmitted throughout the data storage enclosure 202. As eluded to above, reducing the amount of acoustic energy can decrease performance degradation of the data storage devices 206 positioned within the data storage enclosure 202.

The present disclosure features another approach for reducing the impact of acoustic energy, by positioning the air movers 216A-D farther away from the data storage devices 206 than conventional enclosures. In conventional enclosure, fans are positioned as close as one or two inches from data storage devices. With the air movers 216A-D positioned farther from the data storage devices 206, less of the acoustic energy generated by the fans impacts the data storage devices 206. In certain embodiments of the present disclosure, the air movers 216A-D are positioned five to six inches (as measured along a longitudinal axis 232 of the enclosure 200) from the data storage devices 206. As a result, there is a space 234 in the cooling area 226 between the air movers 216A-D and the data storage devices 206 that is greater than conventional enclosure. At least part of the space 234 can be filled with one or more acoustic baffles to further attenuate the amount of acoustic energy that impacts the data storage devices 206. Further, some or all of the surfaces in the space 234 can be covered by an acoustic absorptive material 236 (e.g., non-metal materials such as cloth fabrics and porous polymer-based materials such as polyurethane-based foam). The acoustic absorptive material 236 can attenuate the acoustic energy generated by the air movers 216A-D.

The present disclosure also features an approach for reducing the impact of chassis vibration (e.g., energy transmitted through the chassis 208 itself). During operation, the air movers 216A-D generate chassis vibration in addition to acoustic energy. Like acoustic energy, chassis vibration can negatively impact the performance of data storage devices. In conventional enclosures, fans are positioned close to the data storages such that chassis vibration has a comparatively short path to travel to reach the data storage devices, which increases the risk of chassis vibration affecting performance of the data storage devices. In certain embodiments of the present disclosure, the air movers 216A-D are positioned such that chassis vibration generated by the air movers 216A-D has a longer path to travel along the chassis 208 before impacting the data storage devices 206. For example, in certain embodiments of the present disclosure, the chassis vibration generated by one of the air movers 216A-D must travel through the back wall 210J, through the second side wall 210C, through the sliding features 224A-C, through the corresponding features on the data storage levels, and through the bottom walls 210D, 210G, and 210H before reaching the data storage devices 206. Further, various features such as dampers can be positioned along the path between the air movers 216A-D and the data storage devices 206 to further dampen the chassis vibration affecting the data storage devices 206.

The present disclosure features another approach for reducing acoustic energy, by positioning power supply units 218 in a separate enclosure and cooling that separate enclosure with its own air movers. In conventional enclosures, power supply units are positioned in the same enclosure as the data storage devices and cooled by the same fans. As the power supply units 218 operate (e.g., converting wall power to 5 volts or 12 volts required by data storage devices), the power supply units 218 generate heat which requires conventional enclosures to use either more fans or more-powerful fans than otherwise needed to cool the enclosure. Further, the power supply units can block air flow within the enclosure. As such, cooling both data storage devices and power supply units with the same fans increases the acoustic energy generated in the enclosure.

In certain embodiments of the present disclosure, the power supply units 218 are positioned in the power supply enclosure 204. As such, the air movers 216A-D positioned in the data storage enclosure 202 can be operated at lower speeds compared to the operating speed required if the power supply units 218 were positioned in the data storage enclosure 202. The power supply enclosure 204 can include air movers 216E-G arranged to cool the power supply units 218. In certain embodiments, the air movers 216E-G in the power supply enclosure 204 are directly attached or integrally formed as part of the power supply units 218. These air movers 216E-G may have a smaller diameter (e.g., <40 mm) than the air movers 216A-D in the data storage enclosure 202. The power supply units 218 are electrically coupled to one or more of the data storage devices 206 and/or the air movers 216A-G.

As alluded to above, a rack such as the rack 102 in FIG. 1 can include multiple enclosures such as the enclosure 200 described above. In such arrangements, the rack would include multiple enclosures each with a separate data storage enclosure (e.g., the data storage enclosure 202) and a separate power supply enclosure (e.g., the power supply enclosure 204). Each separate data storage enclosure within the rack would include multiple data storage devices (positioned among multiple data storage levels) electrically powered by one or more power supply units in the separate power supply enclosure. Each separate data storage enclosure would further include its own set of air movers to provide cooling for the respective data storage devices.

As described above, the enclosure 200 and its components can be designed to incorporate one or more of the arrangements described above to improve performance of data storage systems. For example, the enclosure 200 can be designed to reduce the total amount of acoustic energy and chassis vibration affecting performance by one or more of the following approaches: incorporating fewer air movers, incorporating larger-diameter air movers, operating the air movers at reduced speeds, incorporating acoustic dampening materials, increasing the spacing between the data storage devices and the air movers, extending and or otherwise damping the chassis-vibration path between the data storage devices and the air movers, adding vibration dampers along the chassis-vibration path, and positioning power supply units in an enclosure separate from data storage enclosures.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
   an enclosure including a data storage enclosure and a power supply enclosure separate from the data storage enclosure, the enclosure extending along a longitudinal axis, the data storage enclosure includes multiple storage levels and a shared cooling area;
   power supply units positioned within the power supply enclosure;
   data storage devices positioned within each of the multiple storage levels with each of the multiple storage levels including multiple rows of the data storage devices with each row including a plurality of the data storage devices having respective longitudinal axes oriented perpendicular to the longitudinal axis of the data storage enclosure; and
   a first set of air movers and a second set of air movers positioned within the data storage enclosure in the shared cooling area and arranged to cool the data storage devices, the first set of air movers positioned at a first height and the second set of air movers positioned at a second height that is different than the first height along a back wall of the enclosure.

2. The system of claim 1, wherein the number of storage levels in the data storage enclosure is fewer than the number of air movers in the data storage enclosure.

3. The system of claim 1, wherein the data storage enclosure includes only three storage levels and only four air movers.

4. The system of claim 1, wherein the data storage enclosure does not include power supply units.

5. The system of claim 1, further comprising:
an air mover that is separate from the first and second sets of air movers and positioned within the power supply enclosure.

6. The system of claim 1, wherein the power supply units are electrically coupled to one or more of the data storage devices and/or one or more air movers of the first and second sets of air movers.

7. The system of claim 1, wherein one or more of the data storage levels has a first height, wherein one or more of the air movers in the first and second sets of air movers has a second height that is greater than the first height.

8. The system of claim 1, further comprising:
a rack that houses the enclosure and a plurality of other enclosures each with separate respective data storage enclosures and power supply enclosures.

9. The system of claim 1, wherein each of the data storage levels are slidable with respect to the data storage enclosure and independently slidable with respect to each other.

10. The system of claim 9, wherein the first and second sets of air movers are affixed to the back wall of the enclosure.

11. The system of claim 1, wherein each of the data storage levels includes separate partial enclosures slidable with respect to the data storage enclosure.

12. The system of claim 1, wherein the first set of air movers and the second set of air movers have diameters of 150-220 millimeters.

13. The system of claim 1, further comprising:
a non-metallic acoustic absorptive material covering a metal surface in a space positioned between the data storage devices and the first set of air movers and the second set of air movers.

14. A data storage system comprising:
a rack comprising:
a first enclosure with a first data storage enclosure, the first data storage enclosure including a first set of multiple data storage levels slidable with respect to the first enclosure and a first shared cooling area;
a first set of data storage devices positioned among the first set of multiple data storage levels;
a first set of air movers positioned within the first data storage enclosure in the first shared cooling area and arranged to cool the first set of data storage devices;
a first power supply enclosure housed within the first enclosure;
a first power supply unit positioned within the first power supply enclosure;
a second enclosure with a second data storage enclosure, the second data storage enclosure including a second set of multiple data storage levels slidable with respect to the second enclosure and a second shared cooling area;
a second set of data storage devices positioned among the second set of multiple data storage levels;
a second set of air movers positioned within the second data storage enclosure in the second shared cooling area and arranged to cool the second set of data storage devices;
a second power supply enclosure housed within the second enclosure; and
a second power supply unit positioned within the second power supply enclosure.

15. The data storage system of claim 14, wherein the first set of multiple storage levels has a first height, wherein the first set of air movers has a height greater than the first height.

16. The data storage system of claim 14, wherein the first power supply unit powers the first set of data storage devices, wherein the second power supply unit powers the second set of data storage devices.

17. A system comprising:
an enclosure including a data storage enclosure and a power supply enclosure separate from the data storage enclosure, the enclosure extending along a longitudinal axis, the data storage enclosure includes multiple storage levels and a shared cooling area, wherein the data storage enclosure does not include power supply units;
data storage devices positioned within each of the multiple storage levels with each of the multiple storage levels including multiple rows of the data storage devices with each row including a plurality of the data storage devices having respective longitudinal axes oriented perpendicular to the longitudinal axis of the data storage enclosure; and
a first set of air movers and a second set of air movers positioned within the data storage enclosure in the shared cooling area and arranged to cool the data storage devices, the first set of air movers positioned at a first height and the second set of air movers positioned at a second height that is different than the first height along a back wall of the enclosure.

18. The system of claim 17, wherein each of the data storage levels are slidable with respect to the data storage enclosure and independently slidable with respect to each other.

19. The system of claim 18, further comprising power supply units positioned within the power supply enclosure.

20. The system of claim 19, wherein the first set of air movers and the second set of air movers have diameters of 150-220 millimeters.

* * * * *